(12) United States Patent
Stevenson et al.

(10) Patent No.: US 7,054,041 B2
(45) Date of Patent: May 30, 2006

(54) IMAGE SENSOR METHOD AND APPARATUS HAVING ADDRESSABLE PIXELS AND NON-DESTRUCTIVE READOUT

(75) Inventors: Charles Neil Stevenson, Brookfield, CT (US); Frank J. Schauerte, Berkley, MI (US); John Richard Troxell, Sterling Heights, MI (US)

(73) Assignee: General Motors Corporation, Detroit, MI (US)

( * ) Notice: Subject to any disclaimer, the term of this patent is extended or adjusted under 35 U.S.C. 154(b) by 903 days.

(21) Appl. No.: 10/008,907

(22) Filed: Dec. 6, 2001

(65) Prior Publication Data

US 2003/0107066 A1 Jun. 12, 2003

(51) Int. Cl.
*H04N 1/46* (2006.01)
(52) U.S. Cl. .................. 358/513; 382/312; 250/208.1
(58) Field of Classification Search ............... 358/513, 358/530, 523, 482; 382/305, 312; 250/280.1, 250/553, 214.1; 257/291
See application file for complete search history.

(56) References Cited

U.S. PATENT DOCUMENTS

| | | | |
|---|---|---|---|
| 4,302,804 A | * | 11/1981 | Bader ........................ 363/60 |
| 5,089,983 A | | 2/1992 | Chiang ...................... 364/844 |
| 5,296,696 A | | 3/1994 | Uno ......................... 250/208.1 |
| 5,471,515 A | * | 11/1995 | Fossum et al. .............. 377/60 |
| 5,880,460 A | | 3/1999 | Merrill .................... 250/208.1 |
| 5,909,026 A | | 6/1999 | Zhou et al. .............. 250/208.1 |
| 5,990,506 A | | 11/1999 | Fossum et al. ............ 257/294 |

(Continued)

OTHER PUBLICATIONS

"Image Sensor Method and Apparatus Having Hardware Implemented Edge Detection Processing", Charles Neil Stevenson, et al filed concurrently with this application.

*Primary Examiner*—Kimberly Williams
*Assistant Examiner*—Negussie Worku
(74) *Attorney, Agent, or Firm*—Kathryn A. Marra

(57) ABSTRACT

An image sensor having an array of pixel elements constructed using a two level polysilicon CMOS process that provides individual addressability and a non-destructive readout of the pixels. The pixel elements each includes a substrate, an insulating layer formed on the substrate, a collection capacitor electrode, a transfer electrode, a readout capacitor electrode, and a readout transistor. The transfer electrode is located between the collection and readout capacitor electrodes and all three electrodes are electrically isolated from the substrate and each other by the insulating layer. The collection capacitor electrode and insulating layer are transparent so that incident light can pass through these elements and be absorbed by the substrate. A bias voltage is applied to the collection electrode to form a depletion region in the substrate where photoelectrically generated charge is collected. The charge is then transferred to a second depletion region underneath the readout capacitor electrode by applying a bias voltage to the transfer electrode. The readout transistor has an insulated gate connected to the readout capacitor electrode, so that it can generate a pixel data output signal indicative of the charge that is now stored under the readout capacitor electrode. This reading out of the pixel data is therefore non-destructive, allowing the pixel to be read multiple times without loss of information. An image sensor so constructed can be used in conjunction with on-chip image processing circuits for performing such tasks as edge detection and other algorithms that involve convolutions or other combinations of pixel data.

34 Claims, 2 Drawing Sheets

U.S. PATENT DOCUMENTS 6,021,172 A * 2/2000 Fossum et al. ............... 377/60
6,180,937 B1 * 1/2001 Troxell et al. ........... 250/214.1
6,512,858 B1 * 1/2003 Lyon et al. ................. 382/305
6,734,413 B1 * 5/2004 Dai ......................... 250/208.1
6,856,349 B1 * 2/2005 Trevino ...................... 348/302

* cited by examiner

IMAGE SENSOR METHOD AND APPARATUS HAVING ADDRESSABLE PIXELS AND NON-DESTRUCTIVE READOUT

TECHNICAL FIELD

The invention relates generally to image sensors and, more particularly, to image sensors constructed using CMOS technology.

BACKGROUND OF THE INVENTION

In the field of imaging sensors, charge-coupled devices (CCDs) are the most common type of image sensors in use today for both consumer electronics and machine vision applications. A CCD utilizes charge generated by the photoelectric effect and collected in an individual pixel's potential well. At the end of a light collection period, charge is transferred from one potential well to the next, across a row of pixels. One column of charge is next transferred to a sense node capacitance, where each pixel's charge value is converted to a voltage, and can be read out to form pixel image data. This is a serial process that is dependent on an efficient means of charge transfer from pixel to pixel.

Typically, the pixel is built on 10–20 microns of epitaxial silicon, on top of about 500 microns of silicon substrate. The substrate is highly doped and kept at ground potential. To achieve a high level of pixel-to-pixel charge transfer efficiency, a separate buried channel is fabricated to provide a low-loss path for charge transfer. In such a buried channel CCD structure, light passes through the surface region of the CCD and generates charges in the n- and p-regions. The n-epitaxial region defines the buried channel which collects the electrons from photon induced electron-hole pairs. Electrons generated in the deeper p-region diffuse towards this buried channel, and are also collected there. Doped p-material at the edges of the n-channel is grounded and defines the channel stops between pixel regions.

Various CCD architectures exist: full frame, frame transfer, interline transfer and frame interline transfer. Full frame CCD combines the imaging array with a serial readout register for data transfer. It requires a very fast readout time, or shuttering, to avoid smear as the data is read out serially. It is still used for "long-stare" applications in astronomy. Frame transfer CCD requires two arrays, an imaging array of CCDs, and a light-shielded storage array to receive the image array data in high-speed parallel fashion. A serial readout register then transfers the data from the storage array. An interline transfer CCD has an imaging section made of alternating vertical columns of light detector pixels and readout registers. Image data is transferred immediately to the storage register for fast frame rate and reduced smear, and then the data is transferred to the serial readout register at the edge of the array. There is an inherent 2× loss of resolution in the horizontal direction for interline transfer. Frame interline transfer adds a light-shielded storage array to the image array of the interline transfer CCD, and basically provides an electronic shuttering capability to the imaging system.

A process optimized to fabricate CCD devices is not suitable to fabricate standard complementary metal-oxide semiconductor (CMOS) devices. This presents great difficulty in any attempt to combine CCD and CMOS circuitry on the same chip. Other pixel structures do exist, including charge injection devices (CID) and active pixel sensors (APS); however, like CCDs, the designs in use today for these other structures have their own inherent disadvantages which reduce their suitability for certain types of imaging applications.

As described in Burke and Michon, "Charge-Injection Imaging: Optical Techniques and Performance Characteristics," *IEEE Journal of Solid-State Circuits*, Vol. SC-11, No. 1, pp. 121–127 (1976), CID imagers consist of pixels made of two photocapacitors, one connected to column circuitry and one connected to row circuitry. Row/column circuits select individual pixels and sense charge capacitively on either gate structure. Charge is collected under one photocapacitor, and moved to the other for signal readout. However, this CID technology has significant noise issues associated with its use; for example, large bus capacitance for charge sensing leads to poor charge-to-voltage signal gain, and low noise floors are difficult to achieve throughout the array.

APS imagers utilize pixels that contain at least one active transistor to drive the output lines and aid in charge-to-voltage conversion gain. Thus, APS does not transfer charge serially as does the CCD. See, for example, Mendis, Kemeny, & Fossum, "CMOS Active Pixel Sensor," *IEEE Transactions on Electron Devices*, Vol. 41, No. 3, pp. 452–453, March 1994, and U.S. Pat. Nos. 5,471,515 and 6,021,172 issued to E. R. Fossum et al. One advantage of the APS design is that the imager can be formed from pixels constructed to some extent within the bounds of a CMOS process. This opens up the possibility of incorporating other CMOS circuitry into the sensor.

Most image processing techniques utilize software-based algorithms to process frames of image data outputted from the imaging sensor. The sensor data is converted to digital data and stored in memory for subsequent processing by a microprocessor executing the desired image processing software algorithms. Although suitable for many applications, this approach to image processing can be overly complex for special purpose machine vision applications, resulting in unnecessarily slow frame processing rates using cumbersome hardware and computationally complex software algorithms.

One approach to simplify the desired image processing is to implement at least some portion of it in hardware. However, there are difficulties with this approach as well including, in particular, combining the pixel circuits with other hardware processing circuits, as well as providing storage of pixel values that must be accessed more than once to carry out the hardware processing algorithm. In the case of CCD imagers, the inability to combine the sensor with CMOS devices on a single substrate make on-chip hardware processing difficult if not impossible to accomplish using standard CMOS techniques. Also, while APS imagers of the type noted above can be combined with other CMOS circuitry, and while they provide a pixel array that is independently addressable on a row and column basis, they do not provide a non-destructive readout of data, meaning that the data can only be read once. Since certain signal processing algorithms require multiple use of selected portions on the pixel array, the pixel data must be buffered or otherwise stored so it can be accessed as many times as required by the algorithm. This again increases the complexity and expense of the hardware.

Accordingly, it is a general object of the invention to provide a imaging sensor having individually-addressable pixels that is compatible with CMOS technology and that provides a non-destructive readout which can be read multiple times.

SUMMARY OF THE INVENTION

In accordance with the invention, there is provided a pixel element for sensing light impinging on the pixel element and providing a non-destructive readout representative of the amount of impinging light. The pixel element includes a substrate, an insulating layer formed on the substrate, a collection capacitor electrode, a transfer electrode, a readout capacitor electrode, and a readout transistor. The substrate can be a semiconducting material such as silicon that is capable of forming localized depletion regions in the presence of an applied voltage at those regions. All three electrodes are electrically isolated from the substrate and each other by the insulating layer. The collection capacitor electrode and insulating layer are transparent to light so that incident light can pass through the electrode and insulating layer and be absorbed by the substrate. The transfer electrode is located adjacent both the collection and readout capacitor electrodes. The readout transistor has an insulated gate connected to the readout capacitor electrode, with the transistor providing an output signal that is indicative of the quantity of charge stored in the substrate under the readout capacitor electrode.

With this structure, depletion regions can be formed under the collection and readout capacitor electrodes with the collection depletion region collecting charge generated as a result of the incident light being absorbed by the substrate underneath the collection capacitor electrode. The collected charge can then be transferred to the depletion region under the readout capacitor electrode using the transfer electrode to generate a depletion region that overlaps the collection depletion region and thus permits the charge transfer. Once transferred, this stored charge can be used to activate the readout transistor to generate the output signal representing the pixel data and, since the readout transistor's gate is insulated, this readout of pixel data is done in a non-destructive manner, thereby permitting multiple reads of the data without separate buffering.

In one of its broader aspects, the present invention provides a semiconductor structure that can be used as an analog memory element to store data represented by charge that is provided to or otherwise generated at the depletion region underlying the collection capacitor electrode. The charge need not be photoelectrically generated by incident light, but rather can originate in other ways, such as by being introduced electrically, or by static charging, or by pressure (using for example a piezoelectric element), or by electromagnetic radiation outside of the visible or near infrared ranges.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE PREFERRED EMBODIMENTS

Figure 1:
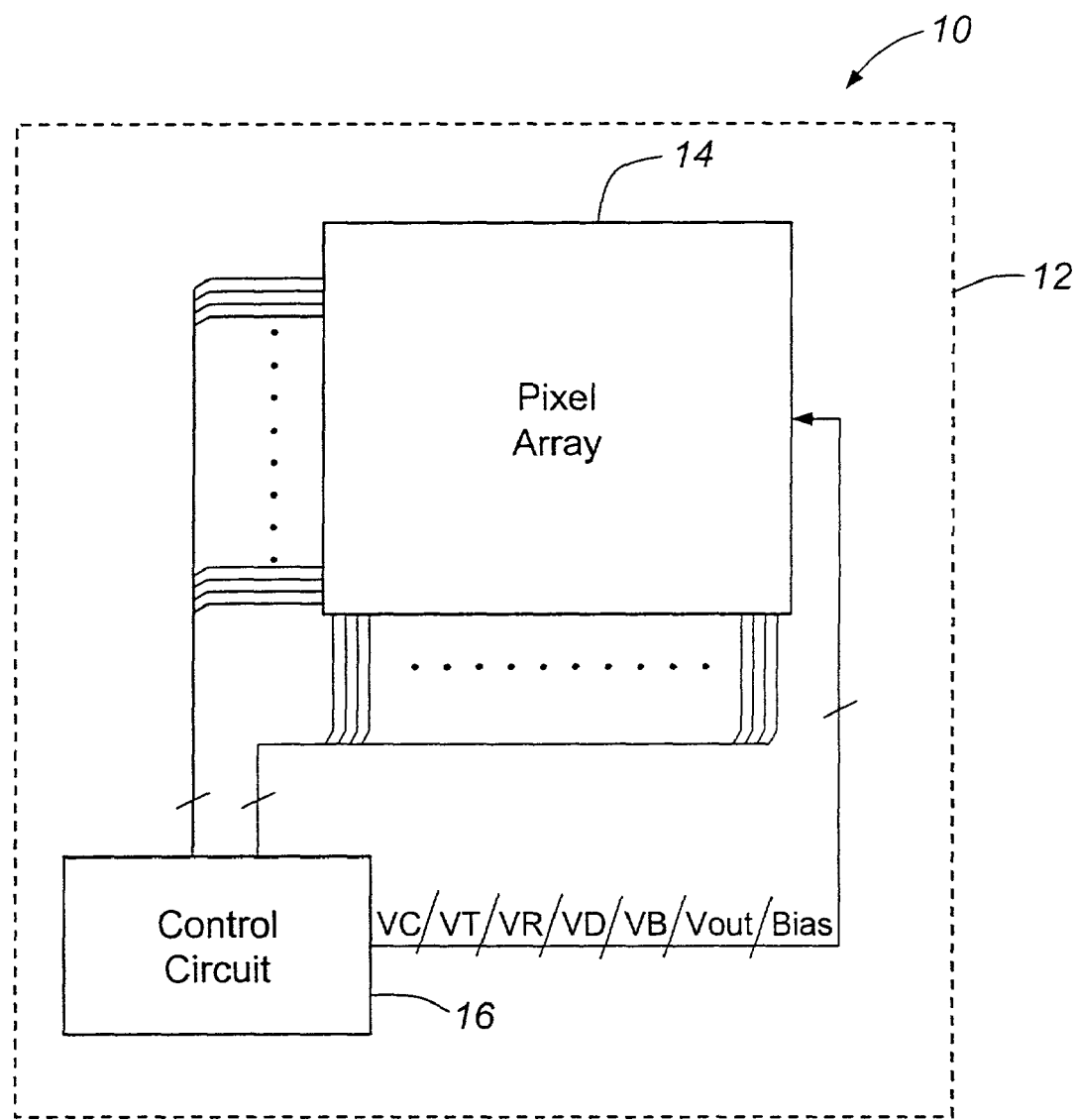
FIG. 1 is a block diagram of preferred embodiment of an image sensor constructed according to the present invention.

Referring to FIG. 1, there is shown an image sensor 10 constructed in accordance with the invention. In general, image sensor 10 comprises an integrated circuit chip 12 that includes an array 14 of light sensitive pixels and a control circuit 16 that provides all of the control requirements for operation of the image sensor 10, including addressing, timing signal generation, and output multiplexing of the pixel data. As will be described below, pixel array 14 is constructed using a CMOS process and in a manner that permits individual addressability of the pixels, as well as a non-destructive readout of the pixel data. These features make the image sensor 10 particularly useful in constructing special purpose image sensors that include on-chip hard-wired processing of the raw image data produced by the array 14. The CMOS technology makes it much easier than CCD imagers to incorporate the additional processing circuitry on the same chip. The addressability makes it easy to access individual pixel data without the need to buffer whole rows of data. The non-destructibility of the readout makes it possible to implement hardware image processing algorithms on the chip that require multiple reads of individual pixel without having to provide buffers to temporarily store that data.

The circuitry of FIG. 1 is not meant to represent any particular addressing and control strategy for operation and use of pixel array 14. Rather, various suitable designs for control circuit 16 are well known to those skilled in the art. Any modifications that would be needed to known control circuit designs in order to provide the addressing and control of the pixel elements of FIGS. 2 and 3 will be apparent to those skilled in the art. Thus, no further discussion of control circuit 16 is necessary or provided herein.

Figure 2:
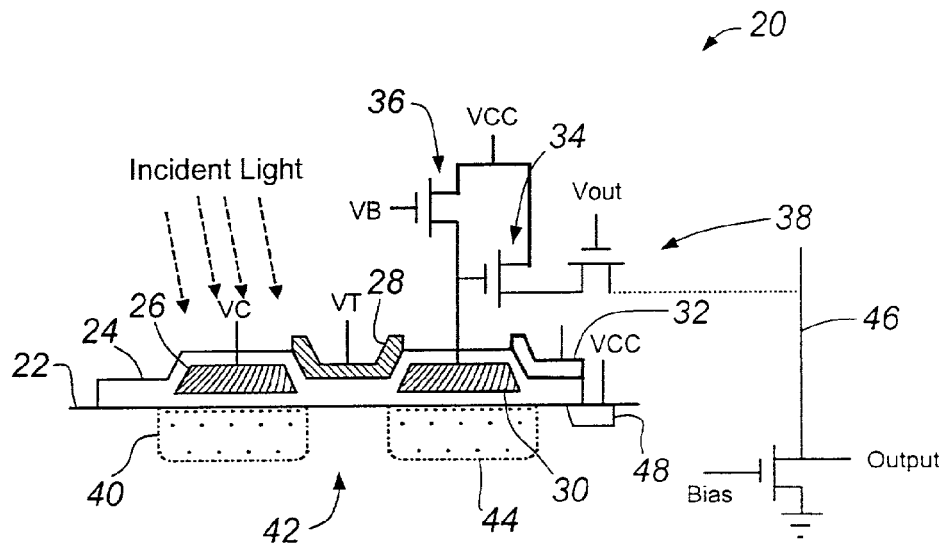
FIG. 2 is a partially diagrammatic and partially schematic cross-sectional view of a pixel element used in the image sensor of FIG. 1.
Figure 3:
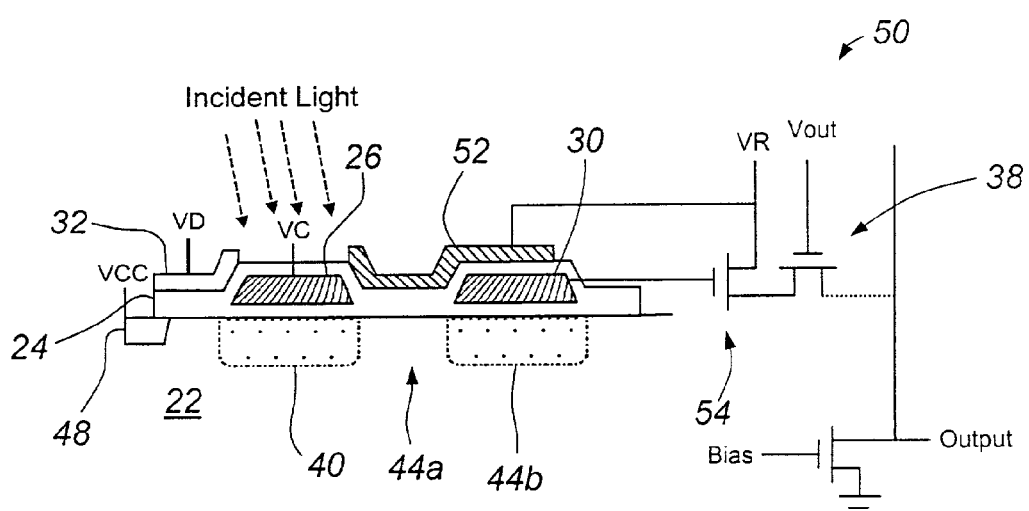
FIG. 3 is a view as in FIG. 2 showing an alternative embodiment of a pixel element constructed in accordance with the invention.

Turning now to FIGS. 2 and 3, there is shown two different embodiments of a single pixel element of the pixel array 14 of FIG. 1. These pixel elements can be fabricated using a standard CMOS two level polysilicon process. For both of these embodiments, the pixel element is fabricated with a crystalline silicon substrate, silicon dioxide insulating layers, a first level polycrystalline silicon collection electrode, a first level polycrystalline silicon readout electrode, a second level polycrystalline silicon transfer electrode, a second level polycrystalline silicon dump electrode, and a readout transistor having an insulated gate connected to the readout electrode. Although the preferred embodiments disclosed herein use a polycrystalline silicon-oxide-semiconductor structure, other suitable material combinations will be apparent to those skilled in the art of microelectronics. Before discussing the specific features and operation of each of the two pixel designs, a general discussion of the common features of their operation will now be provided.

The collection and readout electrodes are located within the insulating layer in spaced relation to the silicon substrate so that they each thereby form a separate photocapacitor. Only the collection photocapacitor is light sensitive due to the provision of an upper level metal layer (not shown) that blocks light from striking the underlying semiconductor structure at any place but the collection electrode. A depletion region, or well, is formed in the silicon substrate underneath the collection capacitor electrode by application of a suitable bias voltage VC (e.g., 5 volts) to this collection electrode. Light energy is collected in this depletion region during an integration period. The light (visible and near infrared) passes through the polysilicon collection electrode and the silicon dioxide insulating layer, both of which are transparent to the light, meaning that at least a substantial portion of the light can pass through these elements. The light is absorbed in the underlying crystalline silicon layer, with the photons producing electron-hole pairs in the underlying depletion region. The electric field in the depletion region separates these pairs, with holes passing to the substrate, and electrons being trapped in the inversion layer which forms in response to the electrode's potential. The amount of charge collected in this inversion layer, or well, during the integration interval is indicative of the intensity of the light impinging on this particular pixel. U.S. Pat. No. 6,180,937 to J. R. Troxell et al. describes a means for increasing the amount of light that can pass through the upper capacitor electrode. The complete disclosure of that patent is hereby incorporated by reference.

Once the integration interval has ended, the collected charge is moved to the readout capacitor electrode. As mentioned above, this readout capacitor is not light sensitive; rather, it is used to store the collected charge for one or more subsequent readouts. The readout electrode acts as a floating gate with the charge on this gate being provided to the insulated gate of the readout transistor, where the charge is converted to an analog voltage and that signal is read out column by column for each row of the array. Since both the readout capacitor electrode and the gate of the readout transistor are insulated, the stored charge is not lost upon readout and can therefore be sampled multiple times using the readout transistor. Thus, the pixel element provides a non-destructive readout of pixel data. After the pixel voltage is read out as many times as needed, the charge is dumped to the positive supply voltage through the dump electrode. Following the dumping of charge, another readout of each pixel (now emptied of signal charge) in the row is performed. The two signals, collected signal and empty well, are available at the chip output for correlated double sampling, which is a common technique that is used to deal with fixed pattern noise caused by circuit variations at individual pixels. The subtraction of the two signals yields only the data value on a pixel by pixel basis over the entire array. For multiple readouts of the pixel data value before dumping of the charge, the previously-read empty well signal can be used for purposes of correlated double sampling.

Referring now more specifically to FIG. 2, the pixel element 20 shown therein includes a substrate 22, a two level insulating layer 24, a collection electrode 26, a transfer electrode 28, a readout electrode 30, a dump electrode 32, a readout transistor 34, a biasing transistor 36, and a output transistor 38. The collection electrode 26, transfer electrode 28, and readout electrode 30 are spaced from the substrate 22 so that, when a biasing voltage is applied to these electrodes, respective depletion regions 40, 42, and 44 are formed in the substrate 22 underneath these electrodes. Only depletion regions 40 and 44 are specifically shown in FIG. 2 for the purpose of clarity in describing the functioning of pixel element 20. As shown, the collection and readout electrodes are laterally spaced such that their depletion regions do not overlap each other. However, the transfer electrode 28 is located adjacent to each of these electrodes and, in particular, between these electrodes at the second polysilicon layer such that, when the biasing voltage is applied to the transfer electrode 28, the resulting depletion region 42 under this electrode overlaps both depletion regions 40 and 44. Thus, transfer electrode 28 can be used to join the collection and readout depletion regions 40, 44 so that charge stored under one can be transferred to, or at least shared with, the other. When no bias voltage is applied to the transfer electrode, the collection and readout depletion regions 40, 44 are isolated from each other and no significant charge transfer occurs between them.

As mentioned above, depletion region 40 is formed by applying a biasing voltage VC to the collection electrode 26. This begins the charge collection process based upon the amount of light impinging upon the pixel element at that electrode. The transfer depletion region 42 is formed by applying a biasing voltage VT to the transfer electrode 28. For the depletion region 44, the biasing voltage is gated through biasing transistor 36 which allows the readout electrode 30 to be isolated from the low impedance voltage supply during readout of the pixel data using the readout transistor 34. Biasing transistor 36 thus has its gate connected to receive a control signal VB, its drain connected as an input to receive a supply voltage VCC (e.g., 5 volts), and its source connected to the readout electrode 30 to supply the VCC bias to that electrode. The readout transistor also has its drain connected as an input to receive the VCC supply voltage, with its source connected to the drain input of the output transistor 38. The source of the output transistor is connected to an output line 46 which can be a common column line to which all output transistors 38 for the pixels in the same column are connected. Of course, output line 46 could also be dedicated to that particular pixel with a multiplexor or other arrangement used to route the pixel data to one of the data outputs of the image sensor. Such arrangements will be known to those skilled in the art. Output of the pixel data through transistor 38 is enabled using the pixel select signal Vout. Referring back briefly to FIG. 1, these signals, as well as the other enable and control signals used by the pixel elements, can be provided by control circuit 16.

Operation of the pixel element 20 will now be described. The necessary timing signals needed to implement the steps described below will be apparent to those skilled in the art. At the beginning of the integration interval, voltage VC is applied to the collection gate electrode 26 of the photosensitive capacitor to form a potential well 40 in the underlying silicon 22. That is, the voltage applied to the collector electrode is of such a magnitude as to dynamically form the depletion region 40 which is larger than that which can exist in thermal equilibrium for the given materials used in the CMOS fabrication process. In the present case, this voltage (5 volts) significantly exceeds the threshold voltage for formation of an inversion layer in the underlying silicon (which is of the order of one volt). Consequently, for time scales of seconds or less, the underlying silicon is essentially in an excited state; any free electrons which are introduced into the depletion region 40 will be immediately accelerated to the vicinity of the interface between the silicon substrate 22 and the overlying silicon dioxide insulator 24. These electrons will form an inversion layer, which is comparable to that formed in many types of MOS field effect transistors, with the singular exception that there are no diffused n-type regions in electrical contact with the inversion layer. Consequently, the inversion layer cannot attain thermodynamic equilibrium with the remainder of the integrated circuit; the charge remains essentially trapped underneath the biased gate electrode of the photocapacitor.

After a suitable integration period, during which charge continues to be collected into this inversion layer in proportion to the amount of light incident upon the photocapacitor, the readout electrode 30 is biased to form the readout well 44 by switching on biasing transistor 36 using signal VB. Also, the transfer electrode 28 is biased to 5 volts using signal VT, thereby forming the depletion region 42. Essentially, this has the effect of electrically connecting the inversion layer beneath the photocapacitor gate 26 and the depletion layer 44 beneath the readout capacitor gate 30. Consequently, charge will distribute proportionately between the two capacitors, and, when the depletion layer 40 of the photocapacitor is collapsed (by reducing the applied voltage VC to zero or some other voltage below the inversion threshold voltage), essentially all of the charge will migrate over underneath the readout gate electrode 30. At this point, the voltage VT on the transfer gate electrode 28 is also reduced (again, for simplicity, assume to 0V), effectively trapping all of the charge underneath the readout gate electrode 30. Under these conditions, the charge that is present underneath the readout electrode 30 can be sampled (i.e., essentially converted to a voltage) by readout transistor 34, and read out to the output circuitry of the imager array by actuating the output transistor 38. It will be appreciated that the act of reading out the charge stored under the readout gate electrode does not change the amount of charge stored, and that the pixel therefore provides a non-destructive readout of the pixel data. Consequently, the readout of charge stored under the readout capacitor electrode 30 can be performed multiple times, limited only by the gradual return to thermal equilibrium of the depletion region 44 of the readout capacitor and the parasitic flow of current through the biasing transistor 36.

After all readouts have been performed, the charge stored on the readout capacitor can be "dumped" by biasing the dump gate electrode 32 to five volts using signal VD. This effectively connects the readout depletion region 44 to a supply connecting region 48 that can be an n-type diffused junction region which is connected to the 5 volt supply (VCC). In this manner the charge is "destroyed" by removing it from the depletion region 44. Also, at this point, another readout operation can be performed to effectively sample the voltage associated with an "empty" readout capacitor. This step is useful in compensating for fixed pattern noise using the correlated double sampling technique noted above.

In the pixel design of FIG. 2, each pixel is comprised of three addressing transistors, two charge storage capacitors, and a total of seven input signals (i.e. input connections). The number of required transistors and input signals can be reduced using the pixel structure 50 of FIG. 3. This pixel circuit performs in a generally analogous manner to that of FIG. 2, but its simpler construction makes possible smaller pixels and thus a smaller overall array. Structurally, the major difference in this circuit from that of FIG. 2 is that the biasing transistor is eliminated with the transfer gate electrode 52 being extended up and over the readout gate electrode 30 so that the readout depletion region can be formed by applying the bias voltage to the transfer electrode 52 rather than to the readout electrode 30. This has the effect of maintaining isolation of the readout electrode during read out of pixel data, yet permits formation of the readout depletion region for purposes of charge transfer from collection depletion region. This also has the advantage that it simplifies the addressing scheme and results in a pixel circuit that requires only two transistors and five signal lines. The overlapping of the two polysilicon gate layers is made possible by the use of a standard two-polysilicon layer CMOS fabrication process.

It will be apparent to those skilled in the art of semiconductor device design that the depletion region formed by a bias applied to transfer gate electrode 52 will include regions 44a and 44b. The output signal measured by output transistor 54 is proportional to the charge within the portion of the region 44b. As will be appreciated, the output signal in this embodiment may be reduced, as compared to the output signal in the embodiment shown in FIG. 2, due to the possibly unequal sharing of charge between regions 44a and 44b. Such unequal charge sharing could result if the effective gate insulator thickness between region 44a and transfer electrode 52 is different than that between region 44b and electrode 52. To increase the output signal measured on transistor 54, the threshold voltage for inversion layer formation in region 44a can be increased, which serves to redistribute the charge in favor of region 44b. Such a change in threshold voltage can be achieved by an appropriate implantation or diffusion of additional charged species into the region 44a or into the gate insulator directly above region 44a.

In this embodiment, the readout transistor 54 is biased with signal VR being asserted high when charge transfer from the collection well 40 is desired. This biasing signal is maintained high during readout, with the output of the readout transistor 54 representing charge stored in the readout well that is superimposed on the VR signal. As shown, the dump electrode 32 is on the opposite side of the structure so that both signals VC and VR are asserted in order to dump the charge stored in the transfer/readout depletion regions 44a and 44b. This dump electrode 32, along with the n-type diffused junction region 48 could also be placed at the location shown in FIG. 2, if desired.

Although the size of the transfer electrode in the area between the collection and readout electrodes is illustrated as being on the same order as that of the collection and readout electrodes themselves, it will be appreciated that in actual practice, this lateral spacing of the collection and readout electrodes can be relatively much smaller so that the depletion region formed by the transfer electrode is substantially limited to the area directly underlying the readout electrode.

An image sensor constructed using the pixel structures described above has the advantages of individual addressability of the pixels and non-destructive readout of the data. It also provides the advantages of using standard CMOS fabrication processes, making the resulting image sensor an excellent candidate for the inclusion of on-chip image processing circuits for such things as edge detection and other algorithms that involve convolutions or other combinations of pixel data.

More generally, it will be appreciated that the pixel structure described above can be extended to non-imaging applications in which the charge stored under the collection electrode is supplied to, or generated in, the depletion region in other ways, such as by being introduced electrically, or by static charging, or by pressure (using for example a piezo-electric element), or by electromagnetic radiation outside of the visible or near infrared ranges. In such an application, the circuits of FIGS. 2 and 3 would comprise memory elements that provide the random access and non-destructibility of read out described above.

It will thus be apparent that there has been provided in accordance with the present invention an image sensor method and apparatus which achieves the aims and advantages specified herein. It will of course be understood that the foregoing description is of preferred exemplary embodiments of the invention and that the invention is not limited to the specific embodiments shown. Various changes and modifications will become apparent to those skilled in the art and all such variations and modifications are intended to come within the scope of the appended claims.

We claim:

1. A pixel element for sensing light impinging on the pixel element and providing a non-destructive readout representative of the amount of impinging light, comprising:
   a substrate capable of forming localized depletion regions in the presence of an applied voltage at the regions;
   an insulating layer formed on said substrate;
   a collection capacitor electrode in contact with said insulating layer and being electrically isolated from said substrate by said insulating layer, wherein said insulating layer and collection capacitor electrode are transparent to light;
   a transfer electrode located adjacent said collection capacitor electrode and being electrically isolated from said substrate by said insulating layer;
   a readout capacitor electrode located adjacent said transfer electrode and in contact with said insulating layer, said readout capacitor electrode being spaced from said collection capacitor electrode and being electrically isolated from said substrate by said insulating layer; and
   a readout transistor having an insulated gate connected to said readout capacitor electrode, with said transistor providing an output signal that is indicative of the quantity of charge stored in said substrate under said readout capacitor electrode, whereby said readout transistor provides a non-destructive readout of the stored charge.

2. A pixel element as defined in claim 1, further comprising:
   a dump electrode adjacent one of said capacitor electrodes; and
   a supply connecting region in said substrate located adjacent said dump electrode and spaced from said one capacitor electrode, wherein, when a bias voltage is applied to said dump electrode and said supply connecting region of said substrate is connected to a supply voltage, charge stored in said substrate underneath said readout capacitor electrode is transferred to said supply connecting region to thereby reset said pixel element.

3. A pixel element as defined in claim 1, further comprising an output transistor having an input connected to said output of said readout transistor, a gate connected to receive a pixel select signal, and an output, with said output transistor being operable to provide said output signal to its output in response to receiving the pixel select signal on its gate.

4. A pixel element as defined in claim 1, wherein said collection capacitor electrode is located within said insulating layer in spaced relation to said substrate.

5. A pixel element as defined in claim 1, wherein said pixel element comprises a metal oxide semiconductor structure.

6. A pixel element as defined in claim 1, wherein said pixel element comprises a polycrystalline silicon-oxide-semiconductor structure.

7. A pixel element as defined in claim 1, wherein said insulating layer comprises silicon dioxide.

8. A pixel element as defined in claim 1, wherein said collection capacitor electrode comprises polycrystalline silicon.

9. A pixel element as defined in claim 1, wherein said substrate comprises crystalline silicon.

10. A pixel element as defined in claim 1, wherein said readout capacitor electrode is spaced from said collection capacitor electrode such that, when a bias voltage is applied to said capacitor electrodes, a depletion region is formed in said substrate below each of said capacitor electrodes with said depletion regions being electrically isolated from each other and, when a bias voltage is applied to said transfer electrode, a depletion region is formed in said substrate that joins the depletion regions located below said capacitor electrodes.

11. A pixel element as defined in claim 1, further comprising a biasing transistor having a supply input connected to receive a bias voltage, an output connected to said readout capacitor electrode, and a gate connected to receive a bias control signal, wherein, when said biasing transistor is actuated, the biasing voltage is applied to said readout capacitor electrode to thereby form a depletion region in said substrate underneath said readout capacitor electrode and, when said biasing transistor is not actuated, said readout capacitor electrode is isolated from the biasing voltage to thereby enable readout of data from said readout capacitor electrode using said readout transistor.

12. A pixel element as defined in claim 1, wherein said transfer electrode overlies at least a portion of said readout capacitor electrode.

13. An image sensor comprising an array of pixel elements constructed according to claim 1.

14. An image sensor as defined in claim 13, further comprising a control circuit connected to said array of pixel elements, said control circuit being operable to select individual pixel elements within said array and access the output of said readout transistor from a selected pixel element.

15. An image sensor as defined in claim 14, wherein said control circuit includes a plurality of electrical connections to said pixel elements to selectively provide voltages on said electrodes, with said control circuit being operable to provide a voltage on any of said electrodes that creates a depletion region in said substrate below that electrode, and wherein said control circuit is further operable to apply a voltage to said collection capacitor electrode during an integration period to thereby collect charge in the depletion region below said collection capacitor electrode, and then to apply a voltage to said transfer electrode and said readout capacitor electrode to thereby transfer collected charge from the depletion region below said collection capacitor electrode to the depletion region below said readout depletion region, and to thereafter remove the applied voltage from said collection capacitor electrode to thereby collapse the depletion region below said collection capacitor electrode and allow charge underneath said collection capacitor electrode to migrate to the depletion region below said readout capacitor electrode, whereby the depletion region below said readout capacitor electrode contains a charge indicative of the amount of light that impinged upon said collection capacitor electrode during the integration period.

16. A pixel element for sensing light impinging on the pixel element and providing a non-destructive readout representative of the amount of impinging light, comprising:
   a silicon-based substrate capable of forming localized depletion regions in the presence of an applied voltage at the regions;
   a transparent insulating layer formed on said substrate;
   a first polycrystalline silicon electrode formed as a collection electrode that is transparent to light and that is located within said insulating layer such that it is electrically isolated from said substrate by said insulating layer, said collection electrode being spaced from said substrate such that a first depletion region can be formed in said substrate in response to a bias voltage being applied to said collection electrode, wherein light impinging upon said pixel element at said collection electrode is transmitted through said insulating layer and collection electrode and into said substrate where the impinging light forms electron-hole pairs with the electrons being collected in the substrate near the collection electrode;

a second polycrystalline silicon electrode formed as a transfer electrode located laterally adjacent said collection electrode, said transfer electrode being spaced from said substrate by said insulating layer such that a second depletion region can be formed in said substrate in response to a bias voltage being applied to said transfer electrode;

a third polycrystalline silicon electrode formed as a readout electrode that is located within said insulating layer such that it is electrically isolated by said insulating layer from said substrate and said collection and transfer electrodes, said readout electrode being spaced from said substrate such that it provides a readout of charge stored in said substrate under said readout electrode, wherein said second depletion region under said transfer electrode overlaps said first depletion region and permits charged stored in said first depletion region to be transferred to a location in said substrate underneath said readout electrode;

a readout transistor having an insulated gate connected to said readout electrode, with said transistor providing an output signal that is indicative of the quantity of charge stored in said substrate under said readout electrode, whereby said readout transistor provides a non-destructive readout of the stored charge;

an output transistor having an input connected to said output of said readout transistor, a gate connected to receive a pixel select signal, and an output, with said output transistor being operable to provide said output signal to its output in response to receiving the pixel select signal on its gate;

a dump electrode adjacent one of said first, second, and third electrodes; and a supply connecting region in said substrate located adjacent said dump electrode and spaced from said one electrode, wherein, when a bias voltage is applied to said dump electrode with said supply connecting region being connected to a supply voltage, charge stored in said substrate underneath said readout electrode is transferred to said supply connecting region to thereby reset said pixel element.

17. A pixel element as defined in claim 16, further comprising a biasing transistor having a supply input connected to receive a bias voltage, an output connected to said readout electrode, and a gate connected to receive a bias control signal, wherein, when said biasing transistor is actuated, the biasing voltage is applied to said readout electrode to thereby form a third depletion region in said substrate underneath said readout electrode with said first and third depletion regions being separated by an intervening space and said second depletion region being located within said intervening space and overlapping both said first and third depletion regions, and wherein, when said biasing transistor is not actuated, said readout electrode is isolated from the biasing voltage to thereby enable readout of data from said readout electrode using said readout transistor.

18. A pixel element as defined in claim 16, wherein said transfer electrode overlies said readout electrode and said second depletion region is located underneath said readout electrode.

19. A memory element for storing data and providing a non-destructive analog readout of the data, comprising:

a substrate capable of forming localized depletion regions in the presence of an applied voltage at the regions;

an insulating layer formed on said substrate;

a collection capacitor electrode in contact with said insulating layer and being electrically isolated from said substrate by said insulating layer, said collection capacitor electrode being spaced from said substrate such that a first depletion region can be formed in said substrate in response to a bias voltage being applied to said collection capacitor electrode, whereby said substrate can store charge supplied to or generated in said first depletion region;

a transfer electrode located adjacent said collection capacitor electrode and being spaced from said substrate such that a second depletion region can be formed in said substrate in response to a bias voltage being applied to said transfer electrode;

a readout capacitor electrode located adjacent said transfer electrode and in contact with said insulating layer, said readout capacitor electrode being spaced from said substrate such that it provides a readout of charge stored in said substrate under said readout capacitor electrode, wherein said second depletion region under said transfer electrode overlaps said first depletion region and permits charged stored in said first depletion region to be transferred to a location in said substrate underneath said readout capacitor electrode;

a readout transistor having an insulated gate connected to said readout capacitor electrode, with said transistor providing an output signal that is indicative of the quantity of charge stored in said substrate under said readout capacitor electrode, whereby data can be temporarily stored in said first depletion region as stored charge which can then be transferred using said second depletion region to a location underneath said readout capacitor electrode and then used by said readout transistor to provide a non-destructive analog readout of the data.

20. A memory element as defined in claim 19, further comprising:

a dump electrode adjacent one of said capacitor electrodes; and a supply connecting region in said substrate located adjacent said dump electrode and spaced from said one capacitor electrode, wherein, when a bias voltage is applied to said dump electrode and said supply connecting region of said substrate is connected to a supply voltage, charge stored in said substrate underneath said readout capacitor electrode is transferred to said supply connecting region to thereby reset said memory element.

21. A memory element as defined in claim 19, further comprising an output transistor having an input connected to said output of said readout transistor, a gate connected to receive a memory element select signal, and an output, with said output transistor being operable to provide said output signal to its output in response to receiving the memory element select signal on its gate.

22. A memory element as defined in claim 19, wherein said collection capacitor electrode is located within said insulating layer in spaced relation to said substrate.

23. A memory element as defined in claim 19, wherein said memory element comprises a metal oxide semiconductor structure.

24. A memory element as defined in claim 19, wherein said memory element comprises a two layer polycrystalline silicon-oxide semiconductor structure.

25. A memory element as defined in claim 19, wherein said insulating layer comprises silicon dioxide.

26. A memory element as defined in claim 19, wherein said collection capacitor electrode comprises polycrystalline silicon.

27. A memory element as defined in claim 19, wherein said substrate comprises crystalline silicon.

28. A memory element as defined in claim 19, further comprising a biasing transistor having a supply input connected to receive a bias voltage, an output connected to said readout capacitor electrode, and a gate connected to receive a bias control signal, wherein, when said biasing transistor is actuated, the biasing voltage is applied to said readout capacitor electrode to thereby form a third depletion region in said substrate underneath said readout capacitor electrode with said first and third depletion regions being separated by an intervening space and said second depletion region being located within said intervening space and overlapping both said first and third depletion regions, and wherein, when said biasing transistor is not actuated, said readout capacitor electrode is isolated from the biasing voltage to thereby enable readout of data from said readout capacitor electrode using said readout transistor.

29. A memory element as defined in claim 19, wherein said transfer electrode overlies said readout capacitor electrode and said second depletion region is located underneath said readout capacitor electrode.

30. A method of providing a non-destructive readout of analog data that is representative of the amount of incident light impinging upon a pixel element, comprising the steps of:

measuring incident light using a photocapacitor that stores charge indicative of the amount of light incident on the photocapacitor;

transferring the stored charge to a second capacitor that is not sensitive to the incident light; and providing the charge stored on the second capacitor to an insulated gate of a transistor that is connected to supply an output signal indicative of the voltage on its insulated gate.

31. The method of claim 30, further comprising the step of gating the output signal using an output transistor.

32. The method of claim 30, further comprising the step of dumping the charge stored on the second capacitor to thereby reset the pixel element.

33. The method of claim 30, wherein said steps are carried out using silicon-based electrodes and a silicon-based substrate, and wherein said transferring step further comprises the step of transferring the stored charge between a first depletion region located in said substrate at said photocapacitor and a second depletion region located in said substrate at said second capacitor.

34. The method of claim 33, wherein said transfer step further comprises using a transfer electrode to create a third depletion region in said substrate that joins said first and second depletion regions.

* * * * *